United States Patent
Taurand

(10) Patent No.: US 6,462,558 B1
(45) Date of Patent: Oct. 8, 2002

(54) ELECTRONIC CIRCUIT FOR MONITORING VOLTAGE VARIATION

(75) Inventor: Christophe Taurand, Valence (FR)

(73) Assignee: Sextant Avionique, Velizy Villacoublay (FR)

( * ) Notice: Subject to any disclaimer, the term of this patent is extended or adjusted under 35 U.S.C. 154(b) by 0 days.

(21) Appl. No.: 09/581,226

(22) PCT Filed: Dec. 18, 1998

(86) PCT No.: PCT/FR98/02789

§ 371 (c)(1),
(2), (4) Date: Jun. 23, 2000

(87) PCT Pub. No.: WO99/34223

PCT Pub. Date: Jul. 8, 1999

(30) Foreign Application Priority Data

Dec. 23, 1997  (FR) ............................................ 97 16346

(51) Int. Cl.[7] ............................................... G01R 27/02
(52) U.S. Cl. ....................................................... 324/606
(58) Field of Search ........................ 324/606; 348/725, 348/730; 455/343; 123/695; 341/144, 145, 154; 327/280, 283, 287; 326/73, 83, 86, 88

(56) References Cited

U.S. PATENT DOCUMENTS

| | | | | |
|---|---|---|---|---|
| 4,170,965 A | * | 10/1979 | Aono | 123/695 |
| 5,736,875 A | * | 4/1998 | Sakamoto et al. | 327/74 |
| 5,790,061 A | * | 8/1998 | Norimatsu | 341/139 |
| 5,867,116 A | * | 2/1999 | Nakamura et al. | 341/159 |
| 5,889,485 A | * | 3/1999 | Schneider | 341/150 |
| 5,969,658 A | * | 10/1999 | Naylor | 341/154 |
| 6,031,389 A | * | 2/2000 | Fotouhi et al. | 326/31 |
| 6,285,568 B1 | | 9/2001 | Taurand | |

* cited by examiner

*Primary Examiner*—N. Le
*Assistant Examiner*—Etienne P LeRoux
(74) *Attorney, Agent, or Firm*—Oblon, Spivak, McClelland, Maier & Neustadt, P.C.

(57) ABSTRACT

An electronic circuit for monitoring electrical voltage where the electronic circuit includes a high threshold terminal and a low threshold terminal and is configured so as to enable a comparison between a high reference voltage and a low reference voltage with voltages detected on the respective terminals. The electronic circuit further includes configurations enabling the prescriptions of voltages at each terminal.

16 Claims, 1 Drawing Sheet

ELECTRONIC CIRCUIT FOR MONITORING VOLTAGE VARIATION

Figure 1:
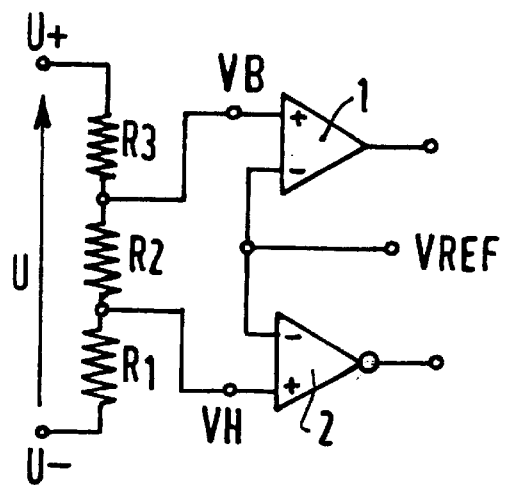

The present invention relates to an electronic circuit for monitoring electrical voltage, and more particularly to such a circuit having a high threshold terminal and a low threshold terminal, and means for comparing the voltage sensed on these terminals with at least one reference voltage. A reference voltage is used to determine whether the voltage on the high threshold terminal is not greater than a predetermined threshold and whether the voltage on the low threshold terminal is not less than a predetermined threshold, which can either be equal to or different from the predetermined threshold for the high threshold terminal.

Such circuits, of the window-based comparator type, are already known. The difficulty arises during fault detection, when it is impossible to determine if the fault stems from the voltage monitored or from the monitoring circuit itself. The monitoring circuit may in fact signal a fault stemming from its own deficiency, when the monitored voltage is normal.

Conversely, and this is the essential point, the monitoring circuit may be faulty, and may fail to signal a fault of the circuit generating the voltage to be monitored. This is important, particularly in the field of avionics, where a fault can sometimes be tolerated because the faulty equipment is backed-up, (i.e., two or three times). It is still important to know that the fault exists.

To this end, according to a first aspect of the invention, there is a monitoring circuit of the type recited above, characterized in that it includes means for prescribing the voltage on the high threshold terminal at a high value greater than a predetermined threshold, and means for prescribing the voltage on the low threshold terminal at a low value less than a predetermined threshold. The low value predetermined threshold may be different than the high value predetermined threshold.

These means make it possible to switch to self-test mode. Indeed, if it is operating normally, the monitoring circuit will have to signal a fault, since the voltage on its high threshold terminal will be less than the predetermined threshold and since, likewise, the voltage on its low threshold terminal will be greater than the predetermined threshold.

It is also evident that a monitoring circuit of the above type may be used to read a Boolean level on each of its inputs, which in this case are independent. Here again this involves providing means allowing a self-test.

To this end, according to another aspect of the invention, there is a monitoring circuit of the type recited above, characterized in that it includes means for prescribing the voltage on the high threshold terminal at a high value greater than a predetermined threshold, and means for prescribing the voltage on the low threshold terminal at a low value less than a predetermined threshold. The low value predetermined threshold may be different than the high value predetermined threshold.

More particularly, the circuit according to the invention may include two comparators, one of the comparators configured to receive on a first of its inputs, the high threshold terminal, during voltage level monitoring, a high voltage derived from the voltage to be monitored, and having a first reference voltage on its other input, the other comparator configured to receive on a first of its inputs, the low threshold terminal, during voltage level monitoring, a low voltage derived from the voltage to be monitored and a second reference voltage on its other input; a first switch provided to apply a high voltage greater than a first reference voltage to one or the other of these inputs, and a second switch making it possible to apply to the other input a low voltage less than the second reference voltage. The low value predetermined threshold may be different than the high value predetermined threshold.

Figure 2:
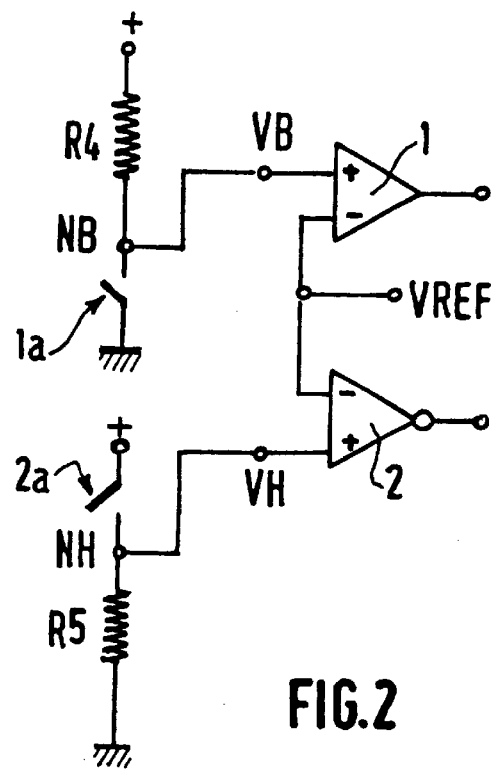
Figure 3:
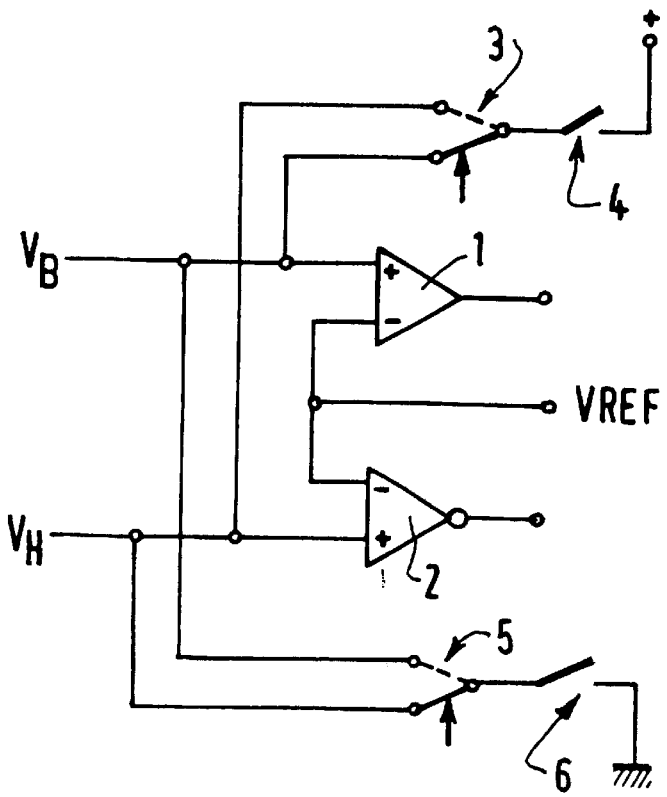

A particular embodiment of the invention will now be described, by way of non-limiting example, with reference to the appended diagrammatic drawings in which:

FIG. 1 is an electronic diagram illustrating the use of this window-based comparator for the monitoring of a voltage in a certain monitoring window, FIG. 2 is an electronic diagram illustrating the use of this window-based comparator for the monitoring of two Boolean levels; and FIG. 3 is a diagram of an electronic monitoring circuit according to the invention.

Depicted in FIG. 1 is a window-based comparator intended for monitoring a DC voltage U between U– and U+.

To this end, the voltage U is divided by a divider bridge consisting of three resistors R1, R2 and R3 in series from U– to U+, in such a way as to obtain an intermediate voltage VH at the common point between R1 and R2 and an intermediate voltage VB at the common point between R2 and R3. The function of the comparator is to check whether the voltage VH is less than a reference voltage and whether the voltage VB is greater than, likewise, a reference voltage. The reference voltages are here both equal to VREF.

The window-based comparator is formed of two comparators 1 and 2, the comparator 2 having its output inverted. The voltage VB is provided to the direct input of the comparator 1. The voltage VH is provided to the direct input of the comparator 2. The same reference voltage VREF is applied to the inverted inputs of the two comparators 1 and 2.

It is consequently found that the output voltage from the comparator 1 will come to its low level when the voltage VB at the point common to R2 and R3 becomes less than the reference voltage. Likewise, the output voltage from the inverting comparator 2 will come to its low level when the voltage VH, at the point common to R1 and R2, becomes greater than the reference voltage.

In the embodiment represented, a fault state will therefore be detected when the output from at least one of the comparators 1 and 2 comes to the low level. Obviously, the levels could be inverted, and a fault state detected when one of the outputs comes to the high level.

Of course, the values of the resistors R1, R2 and R3 are chosen as a function of the reference voltage VREF and of the permitted tolerances on the voltage U.

FIG. 2 illustrates the use of the same comparator for the reading of two Boolean levels.

Here, the input terminal VB of the window-based comparator is depicted linked to one of the terminals NB of a breaker 1a. Likewise, the input terminal VH is linked to one of the terminals NH of a breaker 2a. Moreover, the terminal NB is also linked to the supply by way of a resistor R4 and the terminal NH is also linked to ground by way of a resistor R5. Finally, the other terminal of the breaker 1a is linked directly to ground and the other terminal of the breaker 2a is linked directly to the supply.

By assumption, the device to be monitored causes the closure of one of the breakers 1a or 2a in the event of a fault.

Here it is possible to detect whether one of the breakers 1a or 2a is closed. In fact, the output of the comparator 1 will be at the low level if the breaker 1a is closed and at the high level if the breaker 1a is open. Likewise, the output of the inverting comparator 2 will be at the low level if the breaker 2a is closed and at the high level if the breaker 2a is open.

The diagram of FIG. 3 is that of the complete monitoring circuit, with its self-test functions.

The input VB of the comparator 1 and the input VH of the comparator 2 can now be prescribed either at a high voltage (e.g., supply voltage) or at a low voltage (e.g., ground). To this end, the supply voltage can be linked either to VB or to VH depending on the position of a two-way switch 3. A breaker 4 in series with the switch 3 makes it possible to deactivate the latter.

Likewise, the ground can be linked either to VH or VB depending on the position of a two-way switch 5 which can be deactivated by a breaker 6 in series. The two switches 3 and 5 are operated simultaneously, so that VH is earthed when VB is linked to the supply and, vice versa, VH is linked to the supply when VB is grounded.

In normal mode, the breakers 4 and 6 are open and the monitoring circuit operates as was described with reference to FIGS. 1 and 2, depending on whether it is used for monitoring voltage levels or Boolean levels.

In self-test mode, that is to say when the monitoring circuit is configured to detect any fault state of its own, the switches 3 and 5 are operated as a function of the nature, voltage level or Boolean level of the inputs supplied to VB and VH, and the breakers 4 and 6 are closed successively.

In the case where the circuit is intended for monitoring voltages, as in FIG. 1, the switches 3 and 5 are placed in position, represented by solid lines in FIG. 3.

The input terminal VB is then linked to the supply by closing the breaker 4, in order to perform a triggering test on the terminal VH of the window-based comparator. The result of the test is detected at the output of the comparator 2. If the circuit is operating appropriately, the voltage at the terminal VH will be brought by the resistor R2 to a value greater than the reference voltage VREF, and the output of the comparator 2 will pass to the low level.

The breaker 4 is then reopened and the breaker 6 closed so as to bring the terminal VH to earth. The triggering test is then performed on the terminal VB of the window-based comparator, the result of this test is detected at the output of the comparator 1. If the circuit is operating appropriately, the voltage at the terminal VB will be brought by the resistor R2 to a value less than the reference voltage VREF, and the output of the comparator 1 will pass to the low level.

It is apparent that the detection of a fault in self-test mode (high level at the output of one of the comparators 1 and 2) is inverted with respect to the normal operating mode.

In the case where the circuit is intended for reading Boolean levels as in FIG. 2, the switches 3 and 4 are, in self-test mode, placed in their position represented by dashed lines in FIG. 3.

The detection circuit tied to the input terminal VB is then tested by closing the breaker 6, thereby earthing VB. Appropriate operation of the circuit will therefore bring the potential of the terminal VB below the reference potential VREF, hence the output of the comparator 1 to the low level. This is equivalent to the detection of a fault in normal mode.

The detection circuit tied to the input terminal VH is then tested in the same way by reopening the breaker 6 and closing the breaker 4 so as to bring VH to the supply voltage. If the circuit is operating normally, the potential at the terminal VH will thus be greater than the voltage VREF and the output of the comparator 2 will pass to the low level.

Thus, in all cases, a fault will be detected in self-test mode, through an inversion of the level of the output of one of the comparators 1 and 2 with respect to fault detection in normal mode.

An embodiment using two breakers 4 and 6 and two switches 3 and 5 has been described with reference to FIG. 3. The same result could have been obtained in an equivalent manner with the aid of four breakers.

It would in fact be possible to link the supply to the two input terminals VB and VH, each by way of a breaker. Likewise for the earth, by way of two other breakers. The tests are then performed in each case by closing a breaker, the other three remaining open.

The cross-test which has just been described has the advantage in voltage monitoring mode of guaranteeing the integrity of the resistor R2 and of the connection wires. Furthermore, it has the advantage of requiring only two connection terminals and of being able to be used equally in either of the two operating modes.

What is claimed is:

1. Electronic circuit for monitoring electrical voltage, comprising:

a high threshold terminal and a low threshold terminal, means for comparing a high voltage sensed on said high threshold terminal and a low voltage sensed on said low threshold terminal with a high reference voltage and a low reference voltage, respectively, to determine whether said high voltage sensed on said high threshold terminal is not greater than said high reference voltage set at a high predetermined threshold and to determine whether said low voltage sensed on said low threshold terminal is not less than said low reference voltage set at a low predetermined threshold;

means for prescribing said high voltage on said high threshold terminal at a value less than said high predetermined threshold; and means for prescribing said low voltage on said low threshold terminal at a value greater than said low predetermined threshold.

2. Electronic circuit for monitoring electrical voltage, comprising:

a high threshold terminal and a low threshold terminal, means for comparing a high voltage sensed on said high threshold terminal and a low voltage sensed on said low threshold terminal with a high reference voltage and a low reference voltage, respectively, to determine whether said high voltage sensed on said high threshold terminal is not greater than said high reference voltage set at a high predetermined threshold and to determine whether said low voltage sensed on said low threshold terminal is not less than said low reference voltage set at a low predetermined threshold;

means for prescribing said high voltage on said high threshold terminal at a value greater than said high predetermined threshold; and means for prescribing said low voltage on said low threshold terminal at a value less than said low predetermined threshold.

3. Electronic circuit for monitoring electrical voltage, comprising:

a high threshold terminal and a low threshold terminal, means for comparing a high voltage sensed on said high threshold terminal and a low voltage sensed on said low threshold terminal with a high reference voltage and a low reference voltage, respectively, to determine whether said high voltage sensed on said high threshold terminal is not greater than said high reference voltage set at a high predetermined threshold and to determine whether said low voltage sensed on said low threshold terminal is not less than said low reference voltage set at a low predetermined threshold;

means for prescribing said high voltage on said high threshold terminal either at a value less than said high predetermined threshold or at a value greater than said high predetermined threshold; and means for prescribing said low voltage on said low threshold terminal either at a value greater than said low predetermined threshold or at a value less than said low predetermined threshold.

4. The circuit according to claim 3, further comprising:

two comparators, one of said comparators configured to receive on an input configured to be said high threshold terminal a high voltage derived from a voltage to be monitored and configured to receive on another input configured to be a high reference terminal said high reference voltage, and the other comparator configured to receive on an input configured to be said low threshold terminal a low voltage derived from a voltage to be monitored and configured to receive on another input configured to be a low reference terminal said low reference voltage, a first switch configured to apply a high voltage greater than said high reference voltage to said high threshold terminal and a second switch configured to apply a low voltage less than said low reference voltage to said low threshold terminal.

5. The circuit according to claim 3, further comprising:

two comparators, one of said comparators configured to receive on an input configured to be said high threshold terminal a high voltage derived from a voltage to be monitored and configured to receive on another input configured to be a high reference terminal said high reference voltage, and the other comparator configured to receive on an input configured to be said low threshold terminal a low voltage derived from a voltage to be monitored and configured to receive on another input configured to be a low reference terminal said low reference voltage, a first switch configured to apply a high voltage greater than said high reference voltage to said high threshold terminal and a second switch configured to apply a low voltage less than said low reference voltage to said low reference terminal.

6. The circuit according to claim 3, further comprising:

two comparators, one of said comparators configured to receive on an input configured to be said high threshold terminal a high voltage derived from a voltage to be monitored and configured to receive on another input configured to be a high reference terminal said high reference voltage, and the other comparator configured to receive on an input configured to be said low threshold terminal a low voltage derived from a voltage to be monitored and configured to receive on another input configured to be a low reference terminal said low reference voltage, a first switch configured to apply a high voltage greater than said high reference voltage to said high reference terminal and a second switch configured to apply a low voltage less than said low reference voltage to said low threshold terminal.

7. The circuit according to claim 3, further comprising:

two comparators, one of said comparators configured to receive on an input configured to be said high threshold terminal a high voltage derived from a voltage to be monitored and configured to receive on another input configured to be a high reference terminal said high reference voltage, and the other comparator configured to receive on an input configured to be said low threshold terminal a low voltage derived from a voltage to be monitored and configured to receive on another input configured to be a low reference terminal said low reference voltage, a first switch configured to apply a high voltage greater than said high reference voltage to said high reference terminal and a second switch configured to apply a low voltage less than said low reference voltage to said low reference terminal.

8. A method for monitoring electrical voltage, comprising:

comparing a high voltage sensed on a high threshold terminal and a low voltage sensed on a low threshold terminal with a high reference voltage and a low reference voltage, respectively;

determining whether said high voltage sensed on said high threshold terminal is not greater than said high reference voltage set at a high predetermined threshold and determining whether said low voltage sensed on said low threshold terminal is not less than said low reference voltage set at a low predetermined threshold;

prescribing said high voltage on said high threshold terminal at a value less than said high predetermined threshold; and prescribing said low voltage on said low threshold terminal at a value greater than said low predetermined threshold.

9. A method for monitoring electrical voltage, comprising:

comparing a high voltage sensed on a high threshold terminal and a low voltage sensed on a low threshold terminal with a high reference voltage and a low reference voltage, respectively;

determining whether said high voltage sensed on said high threshold terminal is not greater than said high reference voltage set at a high predetermined threshold and determining whether said low voltage sensed on said low threshold terminal is not less than said low reference voltage set at a low predetermined threshold;

prescribing said high voltage on said high threshold terminal at a value greater than said high predetermined threshold; and prescribing said low voltage on said low threshold terminal at a value less than said low predetermined threshold.

10. A method for monitoring electrical voltage, comprising:

comparing a high voltage sensed on a high threshold terminal and a low voltage sensed on a low threshold terminal with a high reference voltage and a low reference voltage, respectively;

determining whether said high voltage sensed on said high threshold terminal is not greater than said high reference voltage set at a high predetermined threshold and determining whether said low voltage sensed on said low threshold terminal is not less than said low reference voltage set at a low predetermined threshold;

prescribing said high voltage on said high threshold terminal either at a value less than said high predetermined threshold or at a value greater than said high predetermined threshold; and prescribing said low voltage on said low threshold terminal either at a value greater than said low predetermined threshold or at a value less than said low predetermined threshold.

11. The circuit according to claim 1, whereby said means for prescribing said high voltage and said means for prescribing said low voltage comprise a self-test device.

12. The circuit according to claim 2, whereby said means for prescribing said high voltage and said means for prescribing said low voltage comprise a self-test device.

13. The circuit according to claim 3, whereby said means for prescribing said high voltage and said means for prescribing said low voltage comprise a self-test device.

14. The method according to claim 8, further comprising:
comparing said prescribed high voltage on said high threshold terminal with said high predetermined threshold, and comparing said prescribed low voltage on said low threshold terminal with said low predetermined threshold, whereby a self-test function is performed.

15. The method according to claim 9, further comprising:
comparing said prescribed high voltage on said high threshold terminal with said high predetermined threshold, and comparing said prescribed low voltage on said low threshold terminal with said low predetermined threshold, whereby a self-test function is performed.

16. The method according to claim 10, further comprising:
comparing said prescribed high voltage on said high threshold terminal with said high predetermined threshold, and comparing said prescribed low voltage on said low threshold terminal with said low predetermined threshold, whereby a self-test function is performed.

* * * * *